United States Patent
Newland

[19]

[11] Patent Number: 5,949,291
[45] Date of Patent: Sep. 7, 1999

[54] CORDLESS TELEPHONE WITH DIGITAL FREQUENCY ADJUSTMENT

[75] Inventor: Paul B. Newland, Middletown, N.J.

[73] Assignee: Lucent Technologies, Inc., Murray Hill, N.J.

[21] Appl. No.: 09/010,365

[22] Filed: Jan. 21, 1998

[51] Int. Cl.[6] .............................. H03L 7/00; H03B 5/36; H04M 9/00

[52] U.S. Cl. ..................... 331/18; 331/16; 331/25; 331/158; 327/156; 379/55; 379/387; 455/125; 455/297

[58] Field of Search ............................... 331/1 A, 16, 17, 331/18, 25, 36 C, 158; 327/156–159; 455/260, 124, 125, 259; 379/55, 167, 387, 418, 419, 441–443, 446, 455

[56] References Cited

U.S. PATENT DOCUMENTS

| | | |
|---|---|---|
| 4,598,257 | 7/1986 | Southard ................................ 331/2 |
| 4,726,051 | 2/1988 | Schuermann ............................ 379/60 |
| 4,746,879 | 5/1988 | Ma et al. ................................ 331/44 |
| 4,752,748 | 6/1988 | Grzeszykowski ..................... 331/1 A |
| 5,381,475 | 1/1995 | Cavallo ................................ 379/410 |
| 5,459,435 | 10/1995 | Taki ..................................... 331/1 A |
| 5,473,284 | 12/1995 | Jäntti et al. ............................ 331/10 |

*Primary Examiner*—David Mis

[57] ABSTRACT

A digitally-controlled frequency synthesizer circuit is provided. The synthesizer circuit has a synthesizer that provides as an output a signal that is based on a reference frequency supplied from a resonator circuit. The reference frequency of the resonator circuit can be tuned by varying the control voltage applied to a voltage variable capacitor that is coupled to the resonator circuit. The voltage variable capacitor is located on the synthesizer. A digital-to-analog converter is also located on the synthesizer. The digital-to-analog converter provides the analog control voltage for the voltage variable capacitor based on digital voltage control data.

18 Claims, 3 Drawing Sheets

CORDLESS TELEPHONE WITH DIGITAL FREQUENCY ADJUSTMENT

BACKGROUND OF THE INVENTION

This invention relates to synthesizer circuitry having a variable output frequency.

Synthesizer circuits are widely used in applications in telecommunications and other fields. A typical synthesizer contains a phase-locked loop that generates an output frequency that is an integral multiple of a reference frequency provided to the synthesizer by an resonator circuit. The output signal from such synthesizers may be used in wireless transmitter and receiver circuits.

Many synthesizer circuit arrangements are tunable. Typically, adjustments to the output frequency of the synthesizer must be made manually, by adjusting a mechanical variable capacitor in the resonator circuit that is used to provide the reference frequency to the synthesizer. However, such mechanically adjusted arrangements are susceptible to drift.

It is therefore an object of the present invention to provide a frequency-tunable synthesizer circuit that may be adjusted non-mechanically.

It is a further object of the present invention to provide a synthesizer circuit for a cordless telephone that may be adjusted so that its output frequency matches the frequency of another synthesizer.

SUMMARY OF THE INVENTION

These and other objects of the invention are accomplished in accordance with the principles of the present invention by providing a tunable synthesizer circuit. The synthesizer circuit may contain a phase-locked loop circuit or other such arrangement for generating an output signal based on a reference frequency input signal. Such a circuit may provide an output signal that is an integral multiple of the reference frequency.

The reference frequency may be provided by an resonator circuit based on an oscillating crystal arrangement. A voltage variable capacitor in the synthesizer is coupled to the resonator circuit so that the reference frequency provided by the resonatro circuit may be modified by changing the capacitance of the voltage variable capacitor. The voltage variable capacitor may be controlled by an analog control voltage that is provided by a digital-to-analog converter in the synthesizer. The digital-to-analog converter generates the analog control voltage at its output in response to binary voltage control data provided at its input. The digital-to-analog converter may be based on a R-2R resistor network or may use any other suitable digital-to-analog converter arrangement.

The voltage control data provided to the digital-to-analog converter may be provided by a control unit. The control unit may be used during manufacturing to adjust the voltage control data in the digital-to-analog converter while determining whether the frequency of the output signal from the synthesizer matches a predetermined objective frequency. When the frequency of the synthesizer has been adjusted to match the predetermined frequency, the binary value of the voltage control data that was used to the control unit to obtain that match may be stored in nonvolatile memory. Any suitable type of memory may be used, such as electrically-erasable programmable read-only memory.

The control unit may also be used to determine whether the frequency of the output of the synthesizer matches the frequency of the output of another synthesizer. This approach may be used to recalibrate the handset and cradle of a cordless telephone in the field.

The foregoing is only illustrative of certain aspects of the invention, and further features of the invention, its nature and various advantages will be more apparent from the accompanying drawings and the following detailed description of the preferred embodiments.

DETAILED DESCRIPTION OF THE PREFERRED EMBODIMENTS

Figure 1:
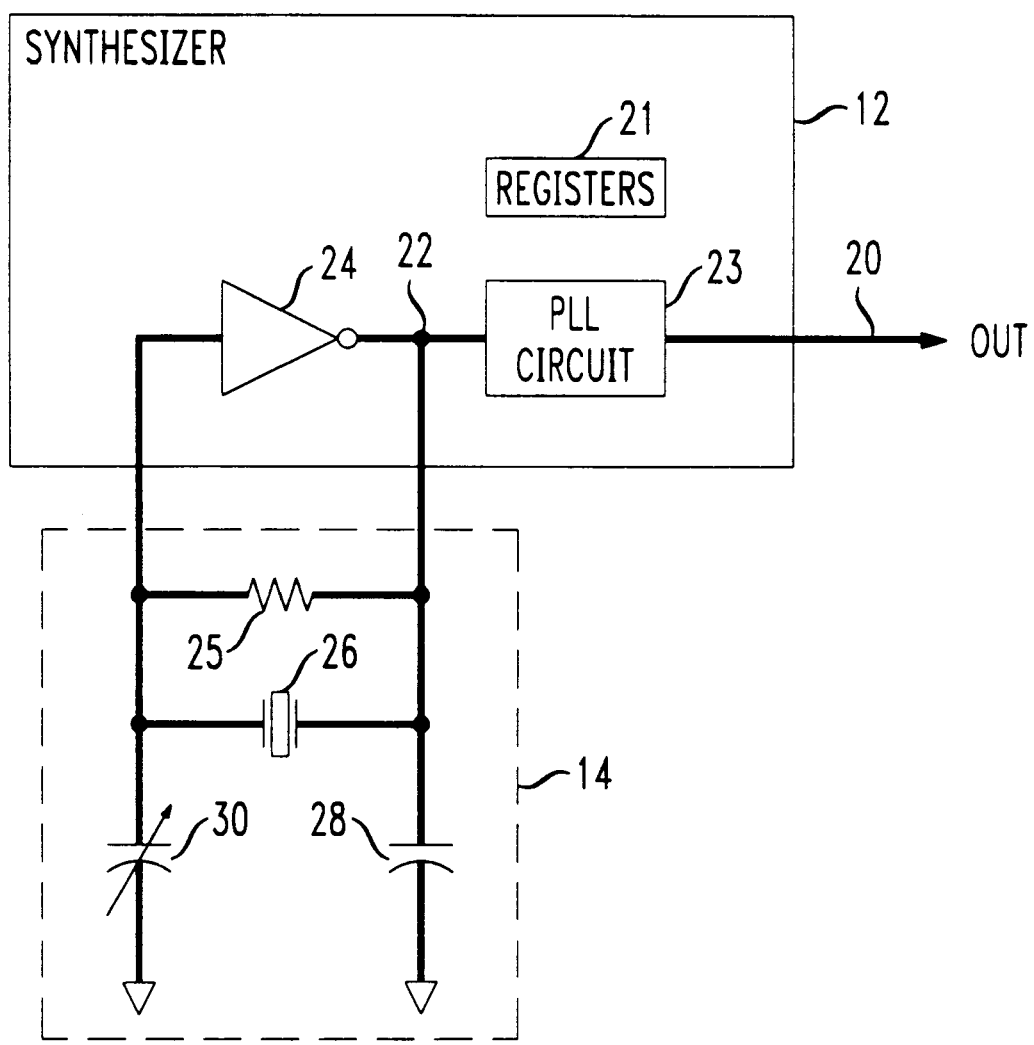
FIG. 1 is a diagram of a conventional synthesizer arrangement.

A conventional synthesizer arrangement 10 for telecommunications applications is shown in FIG. 1. Synthesizer 12 converts a reference frequency signal provided by resonator circuit 14 and gain stage 24 at node 22 to a typically higher-frequency output signal at output 20 using a phase-locked loop circuit 23 that is connected to node 22. The output signal frequency at output 20 is generally an integral multiple of the reference frequency at node 22. Resonator circuit 14 contains resistor 25, crystal 26, capacitor 28, and variable capacitor 30. Variable capacitor 30 can be mechanically tuned by hand or by machine to adjust the frequency of the signal that is provided at node 22. This in turn varies the output frequency provided by synthesizer 12 at output 20. Registers 21 may be used to store configuration data for various components of synthesizer 12.

Synthesizer arrangements such as synthesizer arrangement 10 are typically used by receiver/transmitter circuitry in the handsets and cradles of cordless telephones. Adjusting the frequency of the handset to match the frequency of the cradle is important to ensure a high-quality communications link between these two components. However, because the frequency of the signal at output 20 is adjusted by mechanically adjusting capacitor 30, the frequency setting is susceptible to mechanical drift.

Figure 2:
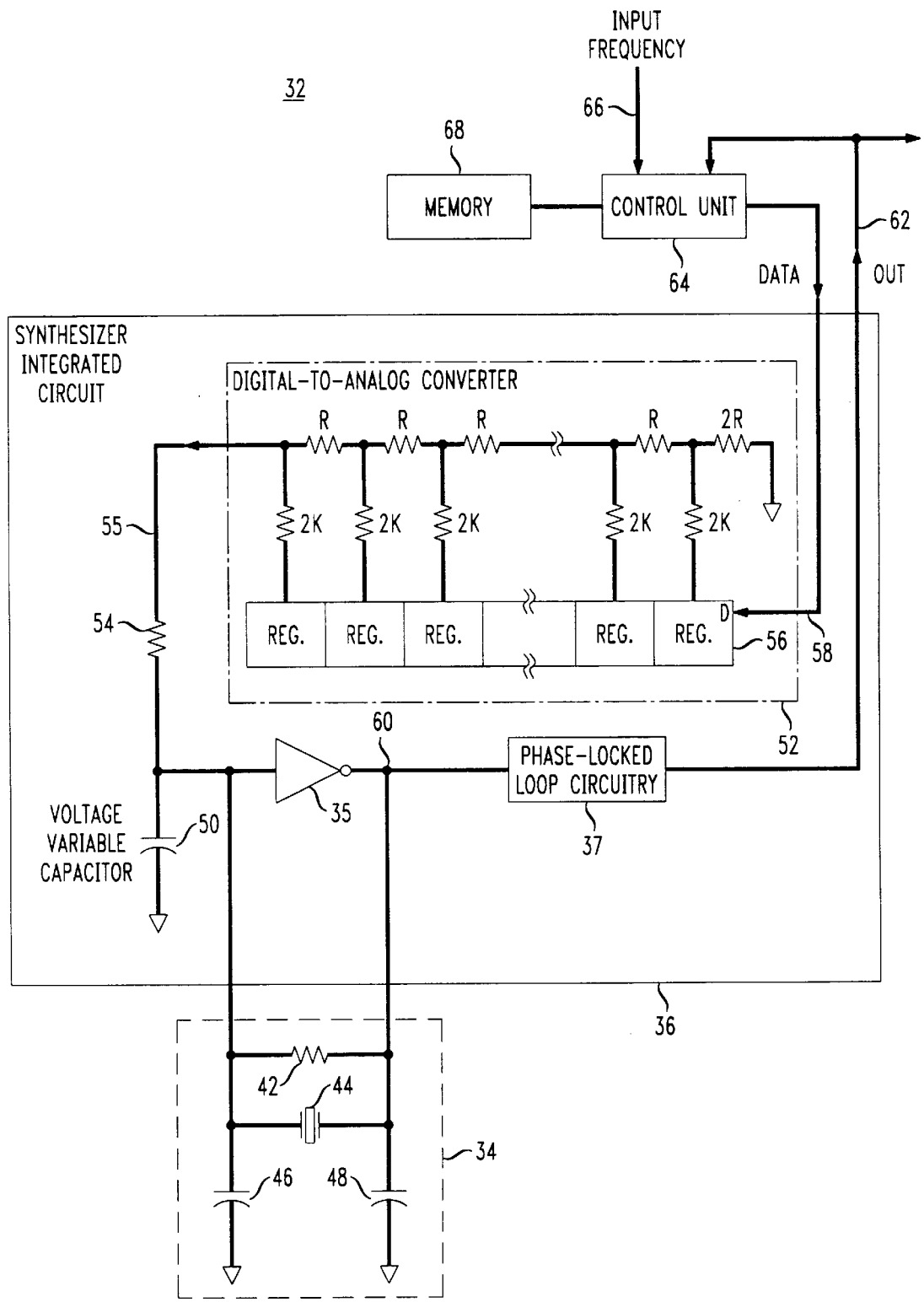
FIG. 2 is a diagram of a synthesizer arrangement in accordance with the present invention.

In accordance with the present invention, a synthesizer arrangement is provided in which the frequency of the output signal may be controlled digitally. In the synthesizer arrangement 32 that is shown in FIG. 2, the output of resonator circuit 34 is provided to synthesizer 36 as a reference frequency using gain stage 35 of synthesizer 36. Resonator circuit 34 uses resistor 42, crystal 44, and capacitors 46 and 48 to generate the reference frequency signal. The capacitance of capacitor 48 is comparable to capacitor 28 of resonator circuit 14 of FIG. 1. Capacitor 46 has a capacitance that is somewhat less than the capacitance of capacitor 30 of FIG. 1.

Voltage variable capacitor 50 interacts with resonator circuitry 34 so that the reference frequency signal of the signal provided to synthesizer 36 at node 60 can be voltage tuned. The capacitance of voltage-variable capacitor 50 is determined by a control voltage supplied to capacitor 50 from digital-to-analog converter 52 via resistor 54 of path 55.

Digital-to-analog converter 52 may be based on an R-2R network as shown in FIG. 2 or may use any other suitable type of digital-to-analog converter circuit such as a converter circuit based on a pulse width modulator, etc. The R-2R network arrangement of digital-to-analog converter 52 converts digital data provided to shift register 56 via data input path 58 to an analog voltage on path 55 by passive resistive superposition. The magnitude of the control voltage supplied to voltage variable capacitor 50 and therefore the frequency of the signal provided at node 60 can be adjusted by providing different digital voltage control signals to shift register 56. Synthesizer 36 preferably contains phase-locked loop circuitry 37 or other such suitable circuitry for generating a generally higher-frequency output signal at synthesizer output 62 based on the reference frequency signal provided at node 60 by oscillator circuit 34. The frequency of the signal at output 62 may be an integral multiple of the reference frequency at node 60.

A control unit such as control unit 64 may be used to supply the voltage control data to shift register 56 that is used to configure synthesizer arrangement 32 so that an output signal of the desired frequency is provided at output 62. Control unit 64 may adjust the voltage control data supplied to shift register 56 to adjust the output frequency of the signal at output 62 either during manufacturing testing of synthesizer arrangement 32 or during adjustments to synthesizer arrangement 32 after installation in equipment in the field. The frequency of the signal at the output 62 may be adjusted by adjusting the binary value of the voltage control data up and down in any suitable fashion until the desired output frequency is obtained.

Adjusting the output frequency in this way during manufacturing allows the manufacturer to calibrate the frequency of synthesizer 36 by comparing the signal at output 62 to a predetermined frequency supplied to input 66 and by storing the corresponding binary value of the voltage control data in a memory such as memory 68. Memory 68 is preferably a nonvolatile memory such as an electrically-erasable programmable read-only memory (EEPROM), but may be any suitable type of memory if desired. When synthesizer arrangement 32 is used in the field, the appropriate value of the voltage control data may be retrieved from memory 68 and provided to shift register 56.

Adjusting the frequency of synthesizer 36 during use of synthesizer arrangement 32 in the field allows the frequency of synthesizer 36 to be calibrated to match the frequency of another signal. The ability to match the frequency of synthesizer 36 to another frequency during use in the field makes it possible to minimize the effects of frequency drift by recalibrating the synthesizers as needed.

Figure 3:
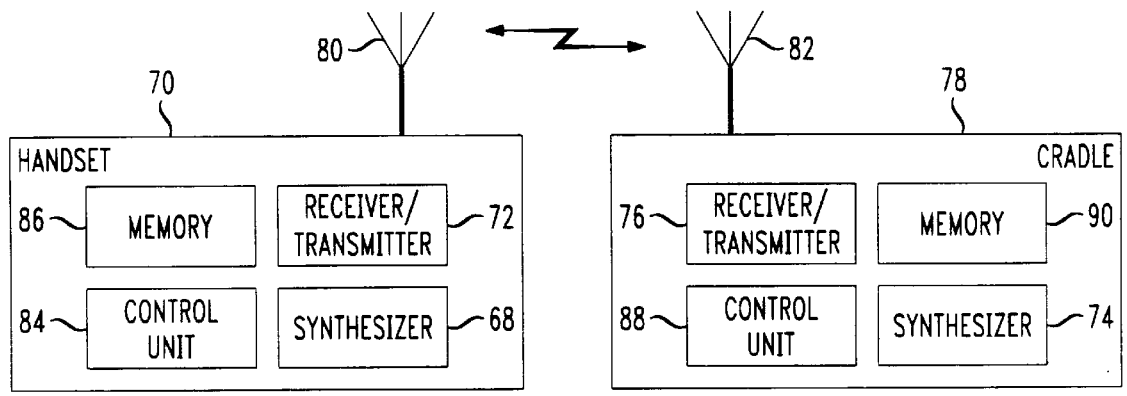
FIG. 3 is a diagram of a cordless telephone handset and cradle in which the synthesizer arrangement of FIG. 2 may be used in accordance with the present invention.

For example, a synthesizer such as synthesizer 36 may be used in a cordless telephone arrangement, as shown in FIG. 3. Synthesizer 68 may be used in handset 70 to generate a radio-frequency signal (e.g., a signal of nominally about 900 MHz) for receiver/transmitter 72. Synthesizer 74 may be used to provide a corresponding radio-frequency signal for receiver/transmitter 76 of cradle 78. Handset 70 and cradle 78 communicate wirelessly via antennas 80 and 82.

Periodically (e.g., during off-hook time just after the handset has left the cradle so that the handset and cradle are in temperature equilibrium), control unit 84 in handset 70 determines whether there is a discrepancy between the frequency of the signal generated locally by synthesizer 68 and the frequency of the signal received from cradle 78 via receiver/transmitter 72. If such an error in frequency is detected, the frequency of handset 70 may be adjusted by control unit 84 until it matches the frequency of the signal from cradle 78. Once the frequency of handset 70 has been adjusted, the binary value of the voltage control data supplied to the shift register in synthesizer 70 may be stored in memory 86.

Additionally (or alternatively), control unit 88 in cradle 78 may periodically determine whether there is a discrepancy between the frequency of the signal generated locally by synthesizer 74 and the frequency of the signal received from handset 70 via receiver/transmitter 76. If a frequency error is detected, the frequency of synthesizer 74 of cradle 78 may be adjusted by control unit 88 until it matches the frequency of the signal from handset 70. Once the frequency of cradle 78 has been adjusted, the binary value of the voltage control data supplied to the shift register in synthesizer 74 may be stored in memory 90.

Figure 4:
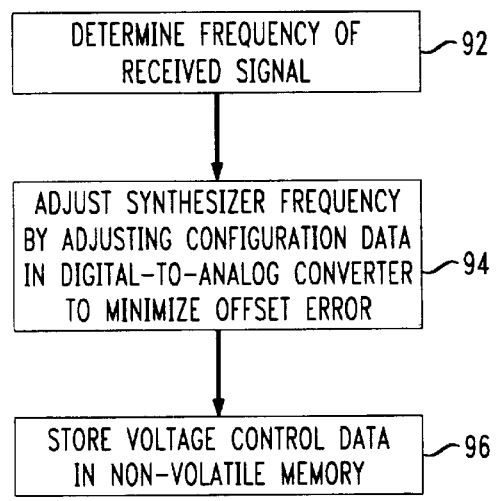
FIG. 4 is a flow chart showing steps involved in setting the frequency of the handset or cradle of FIG. 3 in accordance with the present invention.

Steps involved in adjusting the frequency of a synthesizer such as synthesizer 36 of FIG. 2 to match the frequency of another synthesizer are shown in FIG. 4. At step 92, control unit 64 determines whether the output frequency of synthesizer 36 that is provided at output 62 differs from the frequency of the signal received at input 66. At step 94, control unit 64 adjusts the binary value of the voltage control data provided to shift registers 56 of digital-to-analog converter 52 until the output frequency of synthesizer 36 is substantially the same as the frequency of the signal received at input 66. The binary value of the voltage control data that was successful in matching the frequency at output 62 to the frequency of input 66 is then stored in memory 68 at step 96.

It will be understood that the foregoing is only illustrative of the principles of the invention, and that various modifications can be made by those skilled in the art without departing from the scope and spirit of the invention.

The invention claimed is:

1. A cordless telephone having a handset and a cradle, wherein the handset transmits signals to the telephone cradle and receives signals from the telephone cradle, the cradle operating at a given frequency, the cordless telephone comprising:

a handset receiver/transmitter located in the handset;

a resonator circuit located in the handset for supplying a reference frequency;

a handset synthesizer located in the handset for providing an output signal for the receiver/transmitter having a frequency based on the reference frequency;

a digital-to-analog converter in the handset synthesizer that receives digital voltage control data and that provides a corresponding analog voltage control signal;

a voltage variable capacitor that is located in the handset synthesizer and that is coupled to the resonator circuit, the voltage variable capacitor having a capacitance that is controlled by the analog voltage control signal to adjust the reference frequency and the frequency of the output signal that is based on the reference frequency until the frequency of the output signal matches the given frequency of the cradle; and memory located in the handset in which the digital voltage control data is stored once the frequency of the output signal has been adjusted to match the given frequency of the cradle.

2. The cordless telephone defined in claim 1 further comprising a control unit located in the handset for determining whether the frequency of the output signal matches the given frequency whenever the handset is separated from the cradle after achieving temperature equilibrium, the control unit thereafter adjusting the digital voltage control data until the frequency of the output signal matches the given frequency of the cradle.

3. The cordless telephone defined in claim 1 wherein the memory comprises electrically-erasable programmable read-only memory.

4. The cordless telephone defined in claim 1 wherein the resonator circuit contains a crystal.

5. The cordless telephone defined in claim 1 wherein the digital-to-analog converter contains an R-2R network.

6. The cordless telephone defined in claim 1 further comprising a phase-locked loop circuit for generating the output signal based on the reference frequency.

7. The cordless telephone defined in claim 1 wherein the digital-to-analog converter contains a shift register into which the digital voltage control data is loaded.

8. The cordless telephone defined in claim 1 further comprising means for comparing the frequency of the output signal to a predetermined frequency during manufacturing testing.

9. The cordless telephone defined in claim 1 further comprising means for comparing the frequency of the output signal to the given frequency of the cradle the field.

10. A cordless telephone having a handset and a cradle, wherein the cradle transmits signals to the telephone handset and receives signals from the telephone handset, the handset operating at a given frequency, the cordless telephone comprising:

a cradle receiver/transmitter located in the cradle;

a resonator circuit located in the cradle for supplying a reference frequency;

a cradle synthesizer located in the cradle for providing an output signal for the receiver/transmitter having a frequency based on the reference frequency;

a digital-to-analog converter in the cradle synthesizer that receives digital voltage control data and that provides a corresponding analog voltage control signal;

a voltage variable capacitor that is located in the cradle synthesizer and that is coupled to the resonator circuit, the voltage variable capacitor having a capacitance that is controlled by the analog voltage control signal to adjust the reference frequency and the frequency of the output signal that is based on the reference frequency until the frequency of the output signal matches the given frequency of the handset; and memory located in the cradle in which the digital voltage control data is stored once the frequency of the output signal has been adjusted to match the given frequency of the handset.

11. The cordless telephone defined in claim 10 further comprising a control unit located in the cradle for determining whether the frequency of the cradle output signal matches the given frequency whenever the handset is separated from the cradle after achieving temperature equilibrium, the control unit thereafter adjusting the digital voltage control data until the frequency of the output signal matches the given frequency of the handset.

12. The cordless telephone defined in claim 10 wherein the memory comprises electrically-erasable programmable read-only memory.

13. The cordless telephone defined in claim 10 wherein the resonator circuit contains a crystal.

14. The cordless telephone defined in claim 10 wherein the digital-to-analog converter contains an R-2R network.

15. The cordless telephone defined in claim 10 further comprising a phase-locked loop circuit for generating the output signal based on the reference frequency.

16. The cordless telephone defined in claim 10 wherein the digital-to-analog converter contains a shift register into which the digital voltage control data is loaded.

17. The cordless telephone defined in claim 10 further comprising means for comparing the frequency of the cradle output signal to a predetermined frequency during manufacturing testing.

18. The cordless telephone defined in claim 10 further comprising means for comparing the frequency of the cradle output signal to the given frequency of the handset in the field.

* * * * *